United States Patent
Watanabe et al.

[11] Patent Number: 6,057,592
[45] Date of Patent: May 2, 2000

[54] COMPOUND SEMICONDUCTOR EPITAXIAL WAFER

[75] Inventors: Masataka Watanabe, Gunma-ken; Tsuneyuki Kaise, Annaka; Masayuki Shinohara, Annaka; Masahisa Endou, Annaka; Tohru Takahashi, Annaka, all of Japan

[73] Assignee: Shin-Etsu Handotai Co., Ltd., Tokyo, Japan

[21] Appl. No.: 09/101,431
[22] PCT Filed: Jan. 13, 1997
[86] PCT No.: PCT/JP97/00050
§ 371 Date: Oct. 21, 1998
§ 102(e) Date: Oct. 21, 1998
[87] PCT Pub. No.: WO97/25747
PCT Pub. Date: Jul. 17, 1997

[30] Foreign Application Priority Data

Jan. 12, 1996 [JP] Japan ................................ 8-022029

[51] Int. Cl.$^7$ ........................................ H01L 29/167
[52] U.S. Cl. ................ 257/657; 257/655; 257/190; 257/191
[58] Field of Search ............................ 257/657, 655, 257/190, 191, 65

[56] References Cited

U.S. PATENT DOCUMENTS 4,582,952 4/1986 McNeely et al. .............. 136/249
4,865,655 9/1989 Fujita et al. .................. 148/33
5,751,026 5/1998 Sato et al. .................... 257/190

FOREIGN PATENT DOCUMENTS 408018101 1/1996 Japan.

Primary Examiner—David B. Hardy
Assistant Examiner—Huy Bui
Attorney, Agent, or Firm—Snider & Associates; Ronald R. Snider

[57] ABSTRACT

At the time of forming an alloy composition gradient layer 4 of gallium arsenide phosphide $GaAs_xP_{1-x}$ having an arsenic alloy composition x changed in such a range as not to exceed a predetermined alloy composition a with an increase of a layer thickness d between a GaP layer 3 and a composition constant layer 5 of gallium arsenide phosphide $GaAs_aP_{1-a}$ having the predetermined alloy composition a to be grown above the GaP layer; the alloy composition x is abruptly ascended as in composition ascending zones C11 to C13 with the ascended thickness d of an epitaxial layer and then descended as in crystal stabilizing zones S11 to S13 in such a range as not to cancel the previous ascent amount. One or more combinations of such ascent and descent in the alloy composition are repeated to form as distributed in the alloy composition gradient layer 4, and then the alloy composition x is ascended to the predetermined alloy composition a. Thereby there is obtained a compound semiconductor epitaxial wafer which can effectively eliminate stresses caused by lattice mismatching, can be made thinner with an excellent productivity, and can have a high luminance due to employment of a reflective layer.

7 Claims, 4 Drawing Sheets

COMPOUND SEMICONDUCTOR EPITAXIAL WAFER

TECHNICAL FIELD

This invention relates to a compound semiconductor epitaxial wafer and method for fabricating the wafer and more particularly, to a compound semiconductor epitaxial wafer containing gallium arsenide phosphide $GaAs_zP_{1-z}$ (where $0 \leq z \leq 1$) having a predetermined alloy composition.

BACKGROUND ART

In red-, orange- and yellow-color light emitting diodes, there has been conventionally employed an epitaxial wafer in which an epitaxial layer of gallium arsenide phosphide $GaAs_zP_{1-z}$ (where $0 \leq z \leq 1$) is formed on a single-crystalline substrate of gallium phosphide GaP or gallium arsenide GaAs.

When a lattice mismatching between the single crystal of the substrate of gallium phosphide GaP or gallium arsenide GaAs and the $GaAs_zP_{1-z}$ epitaxial layer having an alloy composition formed on the substrate is large, this causes a misfit dislocation to take place at its interface, whereby a stress caused by the lattice mismatching is relaxed. When this dislocation propagates a composition constant layer, however, this results in that the internal quantum efficiency of the light emitting diode drops.

In order to relax such a lattice mismatching, there has been conventionally employed such an arrangement that an alloy composition gradient layer having a gradually varied alloy composition is provided as an interface between a single-crystalline substrate and a composition constant layer. That is, within the alloy composition gradient layer, an alloy composition gradually ascends along a thickness direction of the layer from an alloy composition of the single-crystalline substrate to a predetermined alloy composition of the composition constant layer. However, this results in that a stress caused by the lattice mismatching gradually accumulates in the entire epitaxial layer and amounts to a larger stress. This leads to generation of a misfit dislocation in the composition constant layer, with the result of reduction in lifetime and reduction in luminance.

For this reason, it has been so far demanded to develop a novel epitaxial wafer which can solve two problems that a misfit dislocation is propagated to the composition constant layer and that a stress caused by the lattice mismatching is exerted on the entire epitaxial layer.

This invention has been made for the purpose of solving the aforementioned problems or defects in the prior art, and an object of this invention is to provide a compound semiconductor epitaxial wafer which is high in luminance, quality and productivity.

DISCLOSURE OF INVENTION

For the purpose of solving the above problems, the inventors of the present application have studied hard how to prevent a misfit dislocation from propagating to a composition constant layer and to effectively eliminate a stress caused by lattice mismatching; and have found from their studies that it is good not to lower the ascending rate of an alloy composition to provide a moderate composition change as known as common knowledge in the prior art, but, to the contrary to the prior art, to provide an abrupt change of the alloy composition and immediately thereafter to somewhat descend the alloy composition backward moderately.

That is, the inventors have noted that the alloy composition is abruptly ascended at appropriate positions in a layer thickness direction in order to locally relax a stress accumulated distributedly in the layer thickness direction due to the lattice mismatching, and immediately thereafter the alloy composition is partially descended moderately thereby to prevent reduction of a crystal quality, and that part of the layer whose alloy composition was abruptly ascended is used as a reflective layer to return light upwardly passed therethrough in the substrate direction to thereby improve a luminance.

Therefore, the inventors, on the basis of such a novel knowledge as mentioned above, have developed a compound semiconductor epitaxial wafer which will be explained below.

That is, in order to realize the above object, there is provided a compound semiconductor epitaxial wafer in which an alloy composition gradient layer of gallium arsenide phosphide $GaAs_xP_{1-x}$ or $GaAs_{1-y}P_y$ having an alloy composition x or y of group V element not composing a substrate of compound semiconductor single crystal of gallium phosphide GaP or gallium arsenide GaAs being changed in a range of 0 to 1 with a thickness direction is formed on the substrate, and a composition constant layer of gallium arsenide phosphide $GaAs_aP_{1-a}$ or $GaAs_{1-b}P_b$ having an alloy composition a or b (where $0 < a \leq 1$, and $0 < b \leq 1$) of group V element not composing the substrate is formed above the alloy composition gradient layer; which is characterized in that at least one combination of a composition ascending zone having the alloy composition x or y ascending with a thickness direction of the alloy composition gradient layer and a crystal stabilizing zone following the composition ascending zone and having the alloy composition x or y descended is formed within the alloy composition gradient layer as distributed in a layer thickness direction, wherein an ascending rate of the alloy composition x or y in the composition ascending zone is 0.1 to 20 with respect to an increase of 1 μm of a growth layer, and a descending rate of the alloy composition x or y in the crystal stabilizing zone is 0.005 to 0.05 with respect to an increase of 1 μm of the growth layer.

Or it is characterized in that the ascending rate of the alloy composition x or y in the composition ascending zone is 0.5 to 5 with respect to an increase of 1 μm of the growth layer.

Or it is characterized in that the ascending rate of the alloy composition x or y in the composition ascending zone is 0.05 to 0.25 per one combination.

Or it is characterized in that, when a thickness of the composition ascending zone is defined as an ascending width and a thickness of said crystal stabilizing zone following the composition ascending zone is as a stabilizing width, a sum of said ascending width and stabilizing width is 1 to 10 μm.

Or it is characterized in that the alloy composition x or y does not exceed the alloy composition a or b in the alloy composition gradient layer.

Or it is characterized in that, in the crystal stabilizing zone, the alloy composition x or y is descended in such a range that an ascent amount in the alloy composition of the composition ascending zone immediately prior to the crystal stabilizing zone is not cancelled.

Or it is characterized in that a composition adjustment zone having the alloy composition x or y ascended to the alloy composition a or b is formed in the vicinity of uppermost one of the alloy composition gradient layers.

With the compound semiconductor epitaxial wafer in accordance with this invention, within the alloy composition gradient layer, at least one combination of the alloy composition abruptly ascended with a large rate and the alloy composition relatively moderately descended following the above is formed as distributed in the layer thickness direction. Since the combination of the abrupt increase and slow decrease of the alloy composition enables local relaxation of stresses generated and distributed in the layer thickness direction by lattice constant mismatching, a high quality of epitaxial wafer can be realized. Simultaneously the abrupt ascent of the alloy composition enables formation of a thinner alloy composition gradient layer. As a result, absorption amount of emitted light depending on the layer thickness can be suppressed. Further, since the layer having the abruptly ascended alloy composition functions as a reflective layer, emitted light passed through the substrate can be reflected to its epitaxial growth direction to improve luminance with its external quantum efficiency increased. Further, by the formation of the thinner alloy composition gradient layer, a productivity can be improved.

BEST MODE FOR CARRYING OUT THE INVENTION

The present invention will be detailed with reference to the accompanying drawings.

Figure 1:
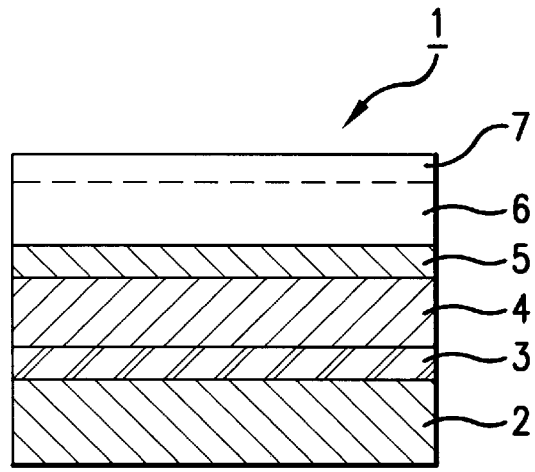
FIG. 1 shows, in a model form, a cross-sectional view of a structure of a compound semiconductor epitaxial wafer in accordance with an embodiment of the present invention.
Figure 2:
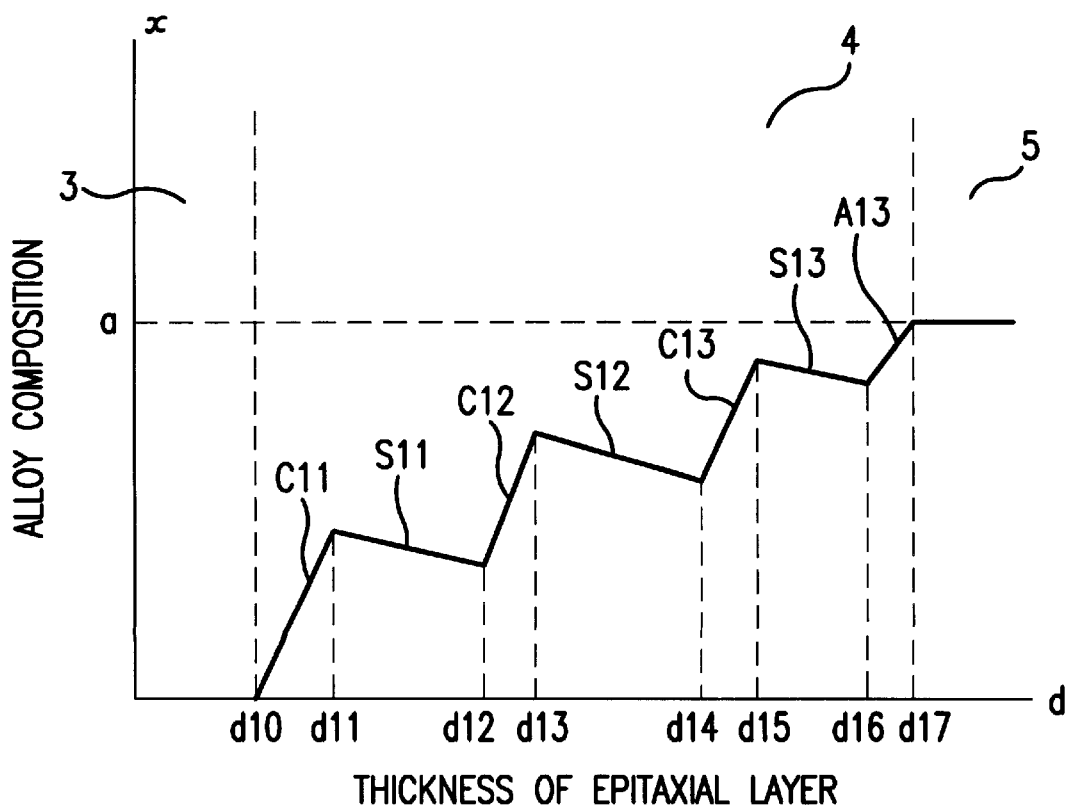
FIG. 2 shows, in a model form, a profile of alloy compositions to a thickness of an epitaxial layer in the compound semiconductor epitaxial wafer of FIG. 1.

FIG. 1 shows, in a model form, a structure of a compound semiconductor epitaxial wafer for a light emitting diode in accordance with an embodiment of the present invention. Further, FIG. 2 shows, in a model form, a profile of alloy compositions to a thickness of an epitaxial layer in FIG. 1.

As shown in FIG. 1, a compound semiconductor epitaxial wafer 1 includes a gallium phosphide GaP epitaxial layer 3 formed on a single-crystalline substrate 2 of gallium phosphide GaP, an alloy composition gradient layer 4 of gallium arsenide phosphide $GaAs_xP_{1-x}$ formed on the gallium phosphide GaP epitaxial layer 3, the layer 4 having an alloy composition x of arsenic of periodic table group V not composing the substrate being varied (ascended or descended) in a layer growth direction, and a composition constant layer 5 of gallium arsenide phosphide $GaAs_aP_{1-a}$ formed on the alloy composition gradient layer 4 of gallium arsenide phosphide $GaAs_xP_{1-x}$ as contacted therewith and having a constant alloy composition a (where $0 \leq a \leq 1$).

Subsequently formed on the compound semiconductor epitaxial wafer 1 of a hetero structure are a composition constant layer 6 of gallium arsenide phosphide $GaAs_aP_{1-a}$ having a constant alloy composition a and doped with nitrogen N as well as a p type diffusion layer 7 having zinc Zn diffused therein to thereby form a p-n junction as a light emitting part. Finally, electrodes are attached to the epitaxial wafer, the epitaxial wafer is cut into a suitable size, and sealed into a package, thus completing a light emitting diode.

In the above case, the single-crystalline substrate is made of gallium phosphide GaP but may be made of the gallium arsenide GaAs similarly. In the latter case, the alloy composition gradient layer is made of gallium arsenide phosphide $GaAs_{1-y}P_y$ having an alloy composition y of phosphorus P being varied (ascended or descended) in the layer growth direction, and the composition constant layer 5 formed on the alloy composition gradient layer is made of gallium arsenide phosphide $GaAs_{1-b}P_b$ having a constant alloy composition b ($0<b\leq 1$).

Explanation will next be made as to a method for fabricating a compound semiconductor epitaxial wafer in accordance with the present invention, on the basis of the profile of the alloy composition to the thickness of the compound semiconductor epitaxial wafer 1 for a light emitting diode. Although the following explanation is directed to an example where the single-crystalline substrate is made of gallium phosphide GaP, the same explanation will similarly hold true even for the gallium arsenide GaAs.

First of all, a gallium phosphide GaP epitaxial layer 3 is formed by a vapor phase epitaxy process on a single crystal substrate 2 of the gallium phosphide GaP. Then formed on the GaP epitaxial layer 3 by the vapor phase epitaxy process is an alloy composition gradient layer 4 of gallium arsenide phosphide $GaAs_xP_{1-x}$ having an alloy composition x ascending as the layer thickness increases in a range of 0 to a.

The alloy composition gradient layer 4 is made up of composition ascending zones C11 to C13 where the alloy composition x abruptly ascends at respective predetermined amounts along with a thickness d of a growth layer, crystal stabilizing zones S11 to S13 where the alloy composition moderately descends at respective predetermined amounts in such a range as not to cancel the previous amounts of ascent in the alloy composition x, and a composition adjustment zone A13 where the alloy composition x ascends to the predetermined alloy composition a in the vicinity of an uppermost layer.

The number of repetitions of combinations of such composition ascending zones and crystal stabilizing zones (C11 and S11, C12 and S12, C13 and S13) is determined by the magnitude of the predetermined alloy composition a and the ascending rate in the alloy composition x. One or more repetitive formations are carried out at each of positions (d10 to d16) distributed in the direction of the thickness d within the alloy composition gradient layer. At this time, it is considered a misfit dislocation takes place in the composition ascending zone and crystal restoration proceeds in the crystal stabilizing zone. When the crystal restoration is insufficient, the misfit dislocation is propagated to the composition constant layer, thus reducing the luminance.

The composition adjustment zone A13 provided after formation (at the position d16) of the crystal stabilizing zone S13 makes the alloy composition x coincide with a predetermined alloy composition a of the composition constant layer 5 at the position d17. Within the alloy composition gradient layer, when the alloy composition x of the arsenic As is ascended in a range not exceeding the alloy composition a as its target value, stress relaxation can be efficiently attained.

The gift of the embodiment of this invention is that the combination of the abrupt composition ascending zone and relatively moderate crystal stabilizing zone is formed repetitively once or more times, that is, the alloy composition is efficiently ascended while the relaxation of the stress caused by the lattice mismatching distributed in the layer thickness direction is effectively carried out locally. As a result, since the alloy composition gradient layer is made thinner and a reflective layer is provided, the luminance can be improved.

Figure 3:
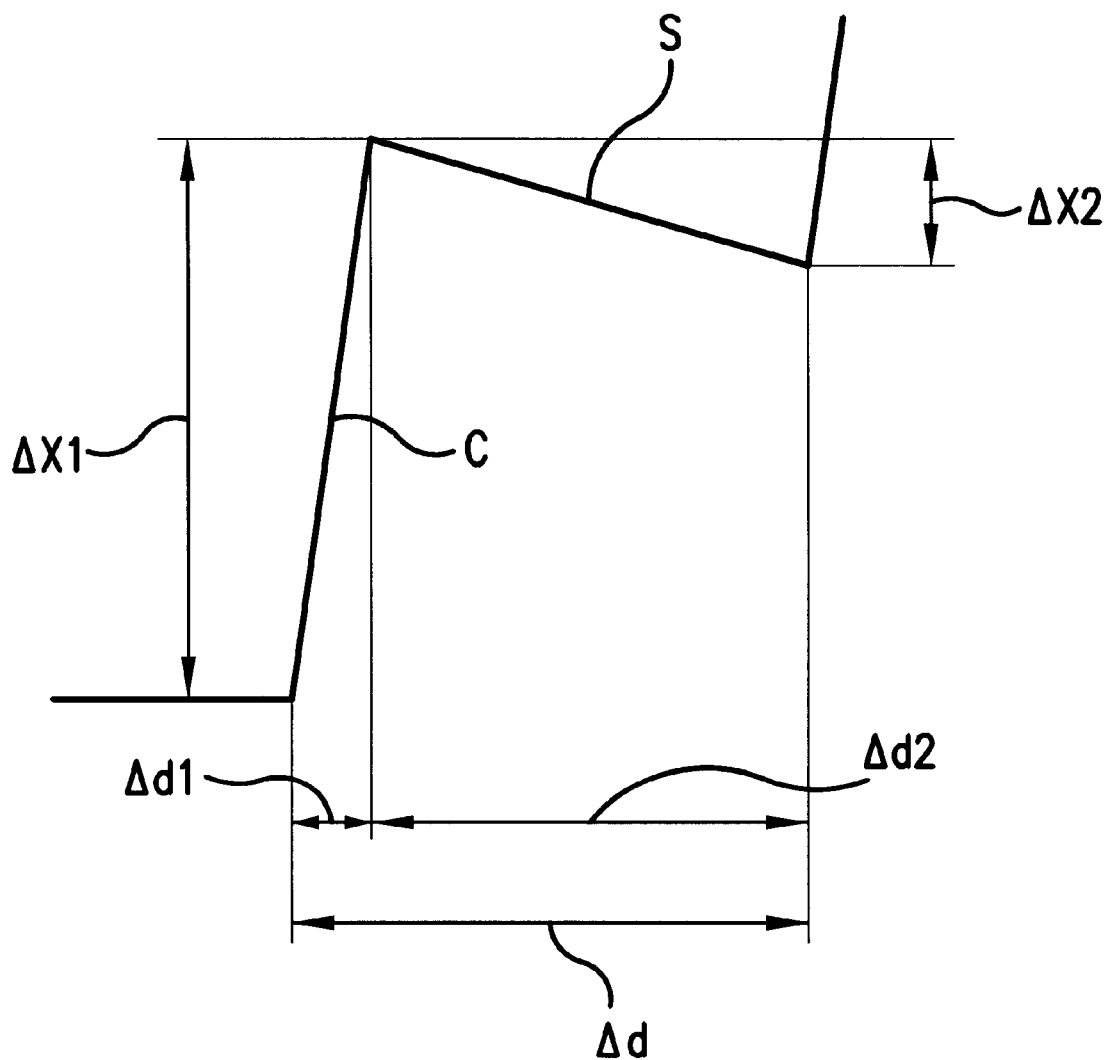
FIG. 3 shows, in a model form, a major part of a profile of alloy compositions in the compound semiconductor epitaxial wafer of the present invention.

Shown, in a model form, in FIG. 3 is a major part of the profile of the alloy composition gradient layer in the compound semiconductor epitaxial wafer of the present invention.

As illustrated in the drawing, the composition ascending zone C abruptly ascends the alloy composition by a $\Delta x1$ for an ascending width $\Delta d1$ of the layer thickness, while the crystal stabilizing zone S followed by the composition ascending zone C moderately descends the alloy composition by a $\Delta x2$ in such a range as not to cancel an immediately previous ascent for a stabilizing width $\Delta d2$. In this case, it is desirable a sum $\Delta d$ of the ascending width $\Delta d1$ and stabilizing width $\Delta d2$ be between 1 and 10 $\mu$m. The crystal quality of the epitaxial layer becomes worse when $\Delta d$ is thinner than 1 $\mu$m. While the composition constant layer becomes as thick as the prior art when $\Delta d$ is thicker than 10 $\mu$m, an improvement in the productivity and luminance cannot be expected.

It is now assumed that, in the alloy composition gradient layer, a rate $\Delta x$ of change of the alloy composition x during 1 $\mu$m increase of the layer thickness is defined as a change rate of the alloy composition. For example, an alloy composition ascending rate of 0.1 means a gradient at which the alloy composition ascends 0.1 for an increased layer thickness of 1 $\mu$m. Similarly, an alloy composition descending rate of 0.2 means a gradient at which the alloy composition descends 0.2 for an ascended layer thickness of 1 $\mu$m.

Figure 4:
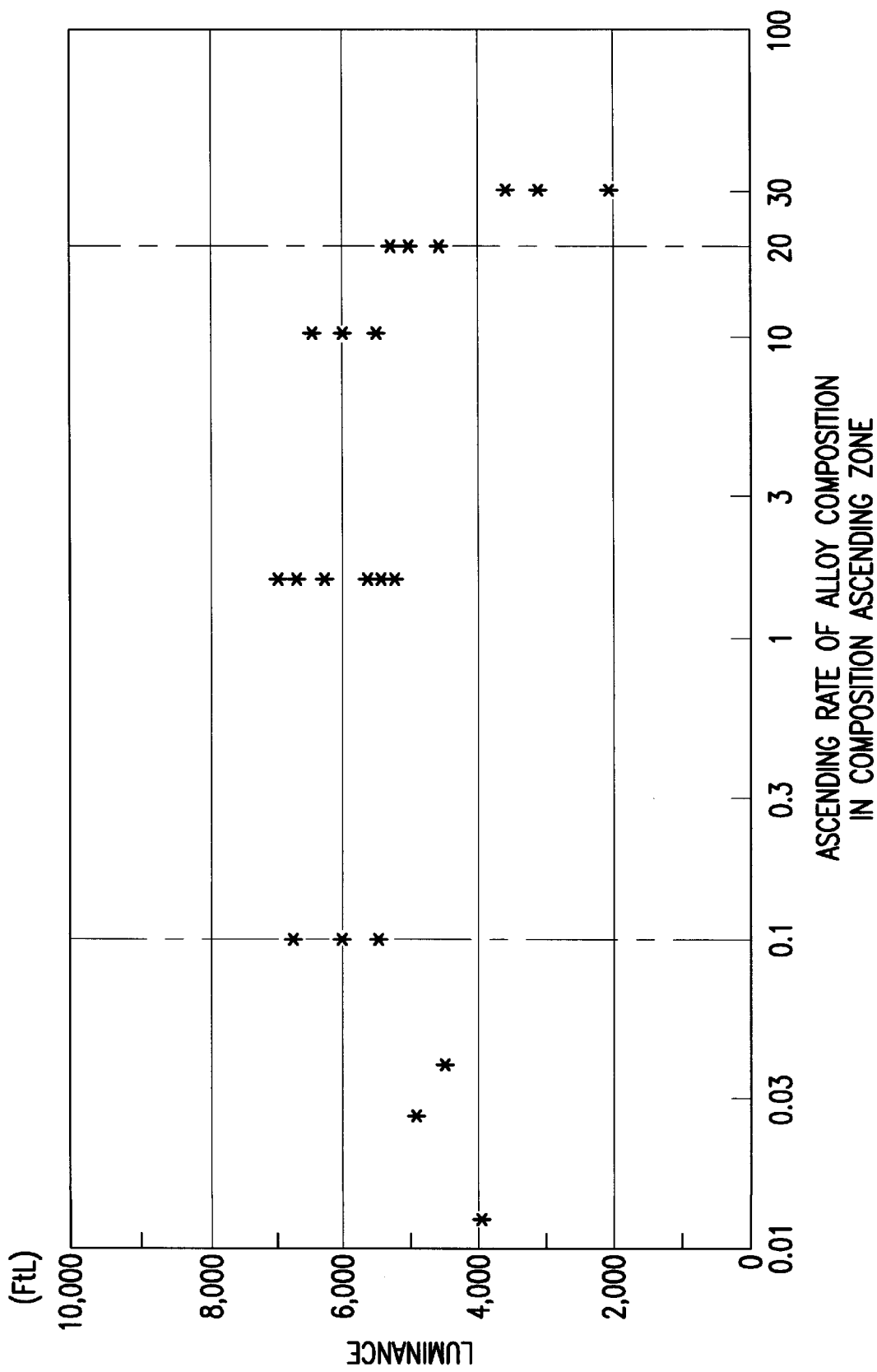
FIG. 4 shows a relationship between ascending rate in the alloy composition in a composition ascending zone and luminance in the compound semiconductor epitaxial wafer of the present invention.

FIG. 4 shows a relationship between ascending rate of the alloy composition in the composition ascending zone and luminance. As illustrated in the drawing, when an ascending rate of the alloy composition x is set at an abrupt value in a range of 0.1 to 20 for an increase of 1 $\mu$m of the growth layer, there can be obtained a high luminance of 5000FtL or more. Further, when the ascending rate of the alloy composition x is set more preferably in a range of 0.5 to 5 for an increase of 1 $\mu$m of the growth layer, the greatest effect can be realized. However, when the ascending rate is smaller than 0.1, the composition ascending zone fails to act as a reflective layer, thus reducing the luminance. When the ascending rate is larger than 20, on the other hand, it becomes difficult to restore the crystallinity with the descending rate of the alloy composition in the crystal stabilizing zone described next, thus reducing the luminance.

Figure 5:
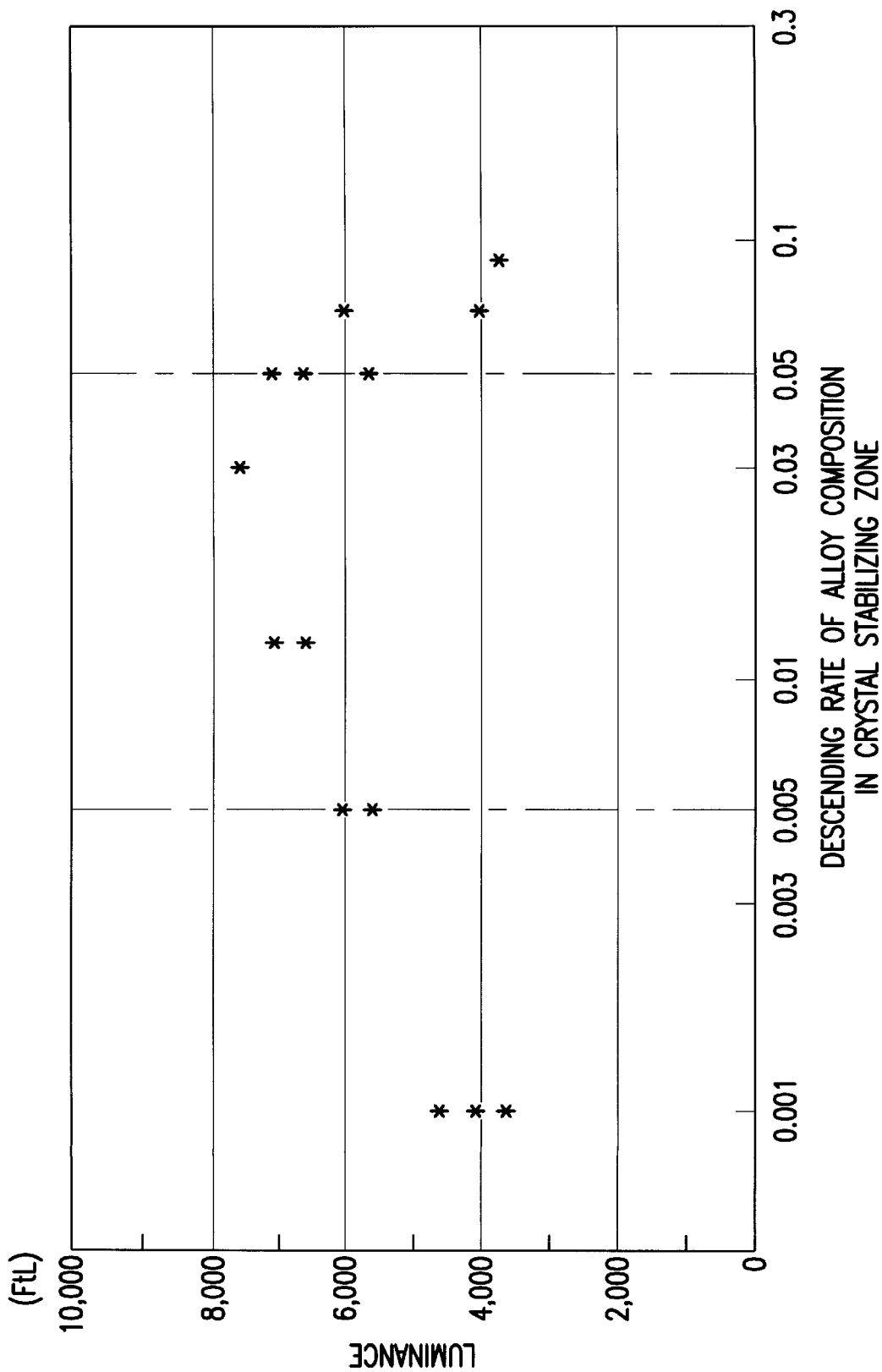
FIG. 5 shows a relationship between descending rate in the alloy composition in a crystal stabilizing zone and luminance.

Meanwhile, FIG. 5 shows a relationship between descending rate of the alloy composition in the crystal stabilizing zone and luminance. As illustrated in the drawing, when the descending rate (gradient of descended amount) of the alloy composition x in the crystal stabilizing zone S is in a range of 0.005 to 0.05 for an ascended thickness of 1 $\mu$m of the growth layer, its productivity becomes good with a high luminance. When the descending rate is set to be smaller than 0.005, the layer thickness becomes too large with reduced productivity and luminance. When the descending rate is set to be larger than 0.05, the crystal restoration becomes insufficient with a reduced luminance. Further, it is preferable that an ascending amount (e.g., $\Delta x1$) in the alloy composition x of each composition ascending zone C be in a range of 0.05 to 0.25. When the ascending amount is smaller than 0.05, the stress relaxation becomes insufficient; whereas, when the ascending amount is larger than 0.25, the epitaxial layer becomes worse in its crystallinity.

The present invention will then be explained in more detail in connection with examples.

EXAMPLE 1

Fabricated in such a manner as will be explained below, was a $GaAs_aP_{1-a}$ epitaxial wafer 1 for orange-color light emitting diode with a composition constant layer having an alloy composition a of 0.34.

A gallium phosphide GaP single crystal was cut into slices having a predetermined thickness, one of which was then subjected to a chemical etching process and a mechanochemical polishing process to form a gallium phosphide GaP mirror-polished wafer having a thickness of about 300 $\mu$m, and the wafer was used as a substrate 2. Used as reaction gases were a hydrogen $H_2$ gas, a 50—ppm hydrogen sulfide $H_2S$ gas diluted with hydrogen, a 10% arsine (hydrogen arsenide $AsH_3$) gas diluted with hydrogen, a 10% phosphine (hydrogen phosphide $PH_3$) gas diluted with hydrogen, a high purity hydrogen chloride HCl gas and a high purity ammonia $NH_3$ gas.

First, the gallium phosphide GaP single-crystalline substrate 2 of an n type having a diameter of 50 mm, a crystal orientation (100) and an off angle of 10 degrees as well as a container having a high purity gallium therein were placed in a vapor phase epitaxial growth furnace at respective predetermined positions, a hydrogen $H_2$ gas was introduced into the furnace as a carrier gas to sufficiently substitute the in-furnace atmosphere, and then the temperature of the furnace was started to raise.

After the temperature of the gallium phosphide GaP single-crystalline substrate 2 reached 820° C., HCl was reacted with Ga within the container while HCl was introduced thereinto at a flow rate of 45 $cm^3$/minute to generate GaCl. At the same time, $H_2S$ and $PH_3$ were introduced at flow rates of 70 $cm^3$/minute and 180 $cm^3$/minute, respectively, to grow an n type GaP epitaxial layer 3 having a thickness of about 3 $\mu$m on the GaP single-crystalline substrate 2 in 30 minutes. All epitaxial layers to grow later are doped with sulfur and of an n type.

Next an alloy composition gradient layer 4 having a composition of $GaAs_xP_{1-x}$ was grown on the above GaP epitaxial layer 3 in such a manner as will be explained below. First, a $PH_3$ flow rate was abruptly descended from 180 $cm^3$/minute to 154.8 $cm^3$/minute and at the same time, an $AsH_3$ flow rate was abruptly ascended from 0 $cm^3$/minute to 25.2 $cm^3$/minute to grow in one minute a $GaAs_xP_{1-x}$ epitaxial layer C11 of about 0.1 $\mu$m thick having an alloy composition x abruptly ascending from 0 to 0.14. A change rate $\Delta x$ of the alloy composition x during the above operation was as abrupt as about 1.4 with respect to an increase of 1 $\mu$m of the growth layer. The epitaxial layer formed during this process corresponds to the first composition ascending zone C11.

Subsequently, the $PH_3$ flow rate was gradually ascended from 154.8 $cm^3$/minute to 160.2 $cm^3$/minute and, at the same time, the $AsH_3$ flow rate was gradually descended from 25.2 $cm^3$/minute to 19.8 $cm^3$/minute to thereby grow in 30 minutes a $GaAs_xP_{1-x}$ epitaxial layer having a stabilizing width of about 3 $\mu$m and having an alloy composition x moderately descending from 0.14 to 0.11 by a vapor phase epitaxy process. A change rate $\Delta x$ of the alloy composition x during this operation was about −0.01 with respect to an increase of 1 $\mu$m of the growth layer. The epitaxial layer formed during this process corresponds to the first crystal stabilizing zone S11.

Through the aforementioned steps, a first layer for relaxing stress was formed at a position of 3 μm from the top surface of the GaP single crystal substrate 2 in the layer thickness direction.

Formed through the repetition of a similar vapor phase growth step were a second composition ascending zone C12 of about 0.1 μm having an alloy composition x abruptly ascending from 0.11 to 0.25 as well as a second crystal stabilizing zone S12 of about 3 μm thick having the alloy composition x moderately descending from 0.25 to 0.22 in this order, so that a second layer for relaxing stress was formed at a position of 6 μm from the top surface of the GaP single-crystalline substrate 2 in the layer thickness direction.

Subsequently formed were a third composition ascending zone C13 of about 0.1 μm thick having an alloy composition x abruptly ascending from 0.22 to 0.34 as well as a third crystal stabilizing zone S13 of about 3 μm thick having an alloy composition x moderately descending from 0.34 to 0.31 in this order, so that a third layer for relaxing stress was formed at a position of 9 μm from the top surface of the GaP single-crystalline substrate 2.

Next grown by the vapor phase epitaxy process was a composition adjustment zone A13 of about 0.4 μm thick having an alloy composition x moderately ascended from 0.31 to 0.34 to match its alloy composition with that of the composition constant layer 5.

Finally grown by the vapor phase epitaxy process were a composition constant layer 5 of 5 μm thick having an alloy composition x of 0.34 as well as a composition constant layer 6 of 20 μm thick doped with nitrogen N as a light emitting center and having the same alloy composition as the composition constant layer 5. Thus, there was obtained an epitaxial wafer having three sets of stress relaxing layers formed in the layer thickness direction and is suitable as an epitaxial wafer for producing orange-color light emitting diode having a central light emission wavelength of 629nm.

The epitaxial wafer of the orange-color light emitting diode had a luminance of 6300FtL, which was improved over the prior art luminance level of 4100FtL.

This invention exhibits remarkable effects which follow. With the compound semiconductor epitaxial wafer in accordance with the present invention, in the alloy composition gradient layer, its alloy composition abruptly ascends with a large ascending rate and then relatively moderately descends, at least one of which combination is formed in the layer thickness direction. Since the combination of such abruptly ascending alloy composition and moderately descending alloy composition enables local relaxation of stresses generated from the lattice constant mismatching as distributed in the layer thick direction, there can be realized a high quality of epitaxial wafer. In addition, since the abrupt ascent of the alloy composition enables formation of a thinner alloy composition gradient layer and formation of the reflective layer, absorption amount of emitted light depending on the layer thickness can be suppressed and light passed through the substrate can be reflected, thus realizing an additionally improved luminance. Further, the formation of the thinner alloy composition gradient layer enables improvement of a productivity.

INDUSTRIAL APPLICABILITY

In this way, in accordance with the present invention, since there can be obtained a $GaAs_xP_{1-x}$ epitaxial wafer which is high in quality, low in costs and highly useful as a high-intensity light emitting diode material, its industrial effects are great.

We claim:

1. A compound semiconductor epitaxial wafer in which an alloy composition gradient layer of gallium arsenide phosphide $GaAs_xP_{1-x}$ or $GaAs_{1-y}P_y$ having an alloy composition x or y of group V element not composing a substrate of compound semiconductor single crystal of gallium phosphide GaP or gallium arsenide GaAs being changed in a range of 0 to 1 with a thickness direction is formed on the substrate, and a composition constant layer of gallium arsenide phosphide $GaAs_aP_{1-a}$ or $GaAs_{1-b}P_b$ having an alloy composition a or b (where $0<a\leq 1$, and $0<b\leq 1$) of group V element not composing the substrate is formed above the alloy composition gradient layer; characterized in that at least one combination of a composition ascending zone having the alloy composition x or y ascending with a thickness direction of the alloy composition and a crystal stabilizing zone following the composition ascending zone and having the alloy composition x or y descending therewith is formed within said alloy composition gradient layer as distributed in a layer thickness direction, wherein an ascending rate of the alloy composition x or y in said composition ascending zone is 0.1 to 20 with respect to an increase of 1 μm of a growth layer, and a descending rate of the alloy composition x or y in said crystal stabilizing zone is 0.005 to 0.05 with respect to an increase of 1 μm of the growth layer.

2. A compound semiconductor epitaxial wafer as set forth in claim 1, characterized in that the ascending rate of the alloy composition x or y in said composition ascending zone is 0.5 to 5 with respect to an increase of 1 μm of the growth layer.

3. A compound semiconductor epitaxial wafer as set forth in claim 1, characterized in that the ascending rate of the alloy composition x or y in said composition ascending zone is 0.05 to 0.25 per one combination.

4. A compound semiconductor epitaxial wafer as set forth in claim 1, characterized in that, when a thickness of said composition ascending zone is defined as an ascending width and a thickness of said crystal stabilizing zone following said composition ascending zone is as a stabilizing width, a sum of said ascending width and stabilizing width is between 1 to 10 μm.

5. A compound semiconductor epitaxial wafer as set forth in claim 1, characterized in that said alloy composition x or y does not exceed said alloy composition a or b in said alloy composition gradient layer.

6. A compound semiconductor epitaxial wafer as set forth in claim 1, characterized in that, in said crystal stabilizing zone, said alloy composition x or y is descended in such a range that an ascent amount in the alloy composition of the composition ascending zone immediately prior to the crystal stabilizing zone is not cancelled.

7. A compound semiconductor epitaxial wafer as set forth in claim 1, characterized in that a composition adjustment zone having said alloy composition x or y ascended to said alloy composition a or b is formed in the vicinity of uppermost one of said alloy composition gradient layer.

* * * * *